(12) United States Patent
Lohmann

(10) Patent No.: US 7,569,843 B2
(45) Date of Patent: Aug. 4, 2009

(54) METHOD FOR PROCESSING RECEIVER SIGNAL AND OPTICAL SENSOR

(75) Inventor: Lutz Lohmann, Olching (DE)

(73) Assignee: Leuze lumiflex GmbH & Co. KG, Fürstenfeldbruck (DE)

( * ) Notice: Subject to any disclaimer, the term of this patent is extended or adjusted under 35 U.S.C. 154(b) by 623 days.

(21) Appl. No.: 11/135,671

(22) Filed: May 24, 2005

(65) Prior Publication Data
US 2005/0265723 A1    Dec. 1, 2005

Related U.S. Application Data

(63) Continuation of application No. 10/996,055, filed on Nov. 24, 2004, now abandoned.

(30) Foreign Application Priority Data
Nov. 25, 2003    (DE) ................................ 103 55 008

(51) Int. Cl.
*G01N 21/86* (2006.01)
*G01V 8/00* (2006.01)
(52) U.S. Cl. .............. 250/559.4; 250/221; 250/214 DC
(58) Field of Classification Search .............. 250/559.4, 250/221, 214 DC
See application file for complete search history.

(56) References Cited

U.S. PATENT DOCUMENTS 5,051,574 A * 9/1991 Yoshida et al. .............. 250/221
6,115,113 A    9/2000 Flockencier
6,151,424 A   11/2000 Hsu
6,603,536 B1   8/2003 Hasson et al.
2003/0137648 A1  7/2003 Van Voorhis et al.
2003/0171918 A1* 9/2003 Sall et al. ..................... 704/216

FOREIGN PATENT DOCUMENTS

DE    39 39 191 C2    4/1992
DE    195 17 001 A1   11/1996
DE    197 17 399 C2   6/1999

* cited by examiner

*Primary Examiner*—Seung C Sohn
(74) *Attorney, Agent, or Firm*—Venable LLP; Robert Kinberg; Steven J. Schwarz

(57) ABSTRACT

The invention relates to a method for processing a receiver output signal, as well as to an optical sensor. The first method step relates to storing the course of a receiver output signal. In a second method step, the receiver output signal is scanned in a predetermined time interval $\Delta t$. The subsequent scanning step relates to correlating the values obtained during the scanning with a filtering matrix, consisting of a sequence of matrix values, for generating a filtered receiver output signal that consists of a discrete sequence of receiver output signal values. In a final method step, the filtered receiver output signal is evaluated with at least one threshold value for generating an object detection signal.

28 Claims, 3 Drawing Sheets

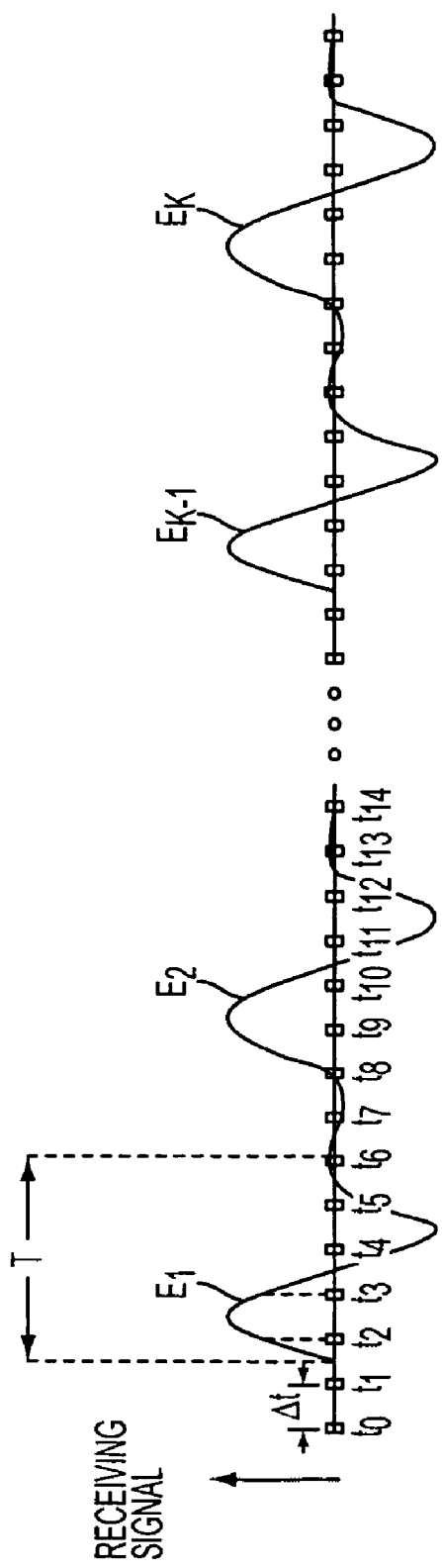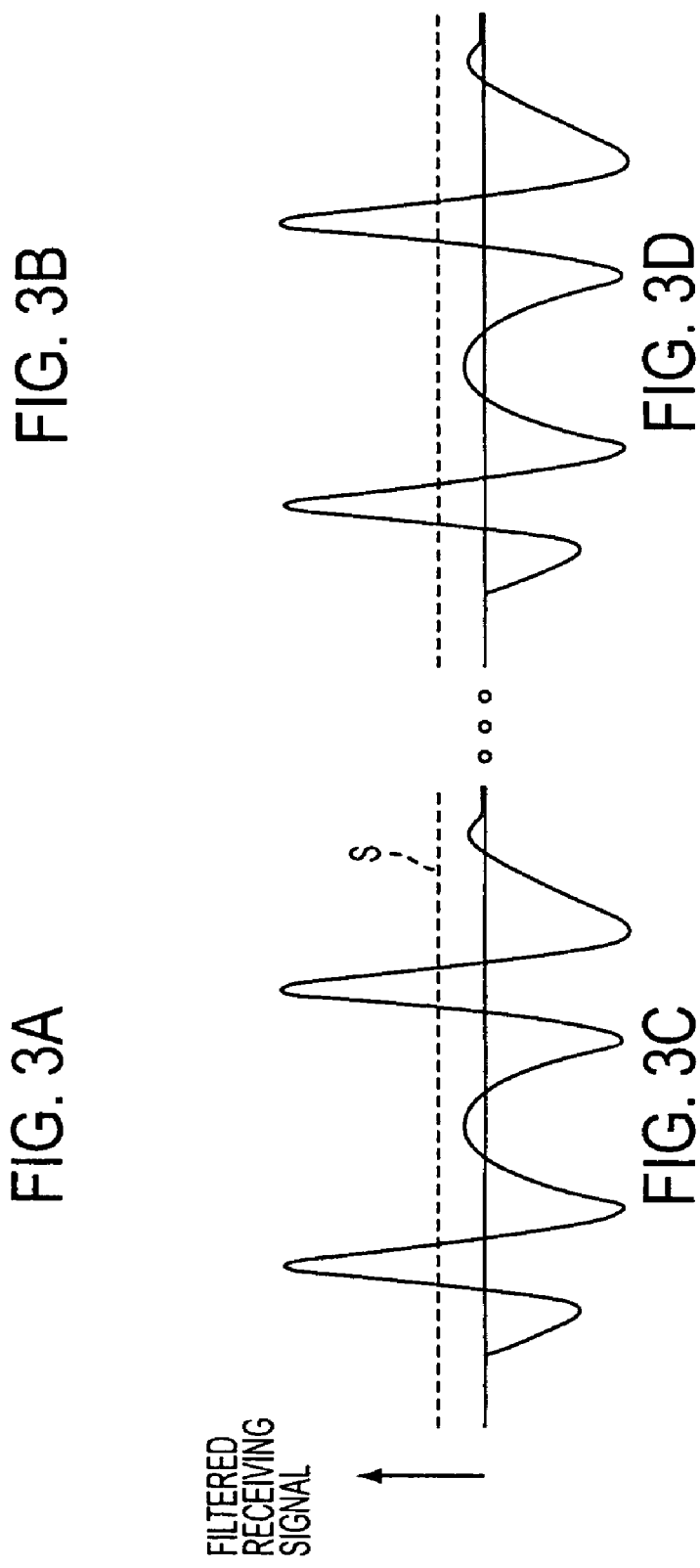

METHOD FOR PROCESSING RECEIVER SIGNAL AND OPTICAL SENSOR

CROSS-REFERENCE TO RELATED APPLICATION

This application is a continuation of application Ser. No. 10/996,055, filed Nov. 24, 2004 and claiming the priority of German Patent Application No. 103 55 008.9 filed on Nov. 25, 2003, which priority is also claimed in the present application. The disclosures of the foregoing applications and each U.S. and foreign patent and patent application mentioned herein are incorporated by reference into this application.

BACKGROUND OF THE INVENTION

The invention relates to a method for processing a received signal, as well as to an optical sensor.

A known optical sensor in the form of a light grid is provided with a predetermined number of transmitter-receiver pairs which define beam axes or paths. The transmitter-receiver pairs are activated cyclically and successively by an evaluation unit. Each transmitter emits transmitting light rays which are guided onto the associated receiver if the beam path is clear. If at least one beam path is interrupted, a shut-down command is generated by the evaluation unit of the light grid, e.g. for shutting down a machine for which the surrounding area is monitored with the light grid.

Individual received signals are present at the outputs of the individual receivers. The receivers and the associated transmitters are successively activated during one cycle. As a result, the evaluation unit records a chronological course of a combined received signal that is composed of the individual received signals coming from the different receivers.

A light grid of this type is described, for example, in German Patent DE 39 39 191 C2 and is provided with a two-channel evaluation unit, having a microcontroller in each evaluation channel. An object detection signal is generated from the received signal in these microcontrollers. The object detection signal indicates whether an object is located in the area to be monitored which is defined by the beam axes. The respective microcontrollers in each evaluation channel are assigned separated analog circuits for amplifying and pre-processing the received signal.

The analog circuit of one evaluation channel in particular comprises a two-channel amplifier and two comparators, installed downstream thereof, which are set to different circuit thresholds. The output signals from the comparators are assigned to a monostable flip-flop circuit. The signal pulses present at the flip-flop are fed to a counter. The received signals are pre-processed with this circuit to detect contamination of the transmitters or receivers.

Analog circuits of this type have the disadvantage of being sensitive to external interfering influences, for example EMC (electromagnetic compatibility) interfering influences and thermal drifts of the individual components.

Such interfering influences lead to distorted and falsified received signals and, in the final analysis, also to incorrect object detections which consequently lead to an undesirable reduction in the detection sensitivity of the light grid.

SUMMARY OF THE INVENTION

It is therefore an object of the present invention to provide a method for processing received signals so that the detection sensitivity of an optical sensor is increased.

The above and other objects of the invention are accomplished according to the invention by the provision of a method for processing a receiver output signal of an optical sensor, comprising the following steps: storing a course of the receiver output signal; scanning the receiver output signal in a predetermined time interval $\Delta t$ to create scanning values; correlating the scanning values with a filtering matrix composed of a sequence of matrix values for generating a filtered receiver output signal composed of a discrete sequence of receiver output signal values; and evaluating the filtered receiver output signal with at least one threshold value for generating an object detection signal.

The method according to the invention is used for processing a receiver output signal of an optical sensor. For this, the course of the receiver output signal is stored in a first method step while, in a second method step, the receiver output signal is scanned in a predetermined time interval $\Delta t$. In a following method step, the obtained scanning values are correlated with a filtering matrix consisting of a sequence of matrix values for generating a filtered receiver output signal, wherein this signal is composed of a discrete sequence of receiver output signal values. In a final method step, the filtered receiver output signal is evaluated with at least one threshold value for generating an object detection signal.

As a result of filtering the receiver output signal by the filtering matrix, the interfering signal portion in the receiver output signal can be suppressed while the useful signal portion in the receiver output signal can simultaneously be emphasized, thus considerably increasing the detection sensitivity of the optical sensor for which the signal evaluation according to the invention is realized.

The method according to the invention is particularly suitable for use with optical sensors embodied as light grids. The light grid is provided with a predetermined number of transmitter-receiver pairs which define the beam axes or paths for the light grid. The transmitter-receiver pairs are activated cyclically and successively. The signal received during one cycle is composed of a chronological sequence of individual receiver output signals from the individual receivers of the light grid. The transmitters which are cyclically activated along with the associated receivers emit transmitting light rays in the form of transmitting light pulses, so that the individual receiver output signals are also in the form of light pulses, wherein the cycle length of each individual receiver output signal is predetermined by the pulse duration of the transmitting light pulses from the associated transmitter.

The combined receiver output signal, consisting of these individual received signals, is scanned in separate, successive scanning steps. A receiver output signal value is generated during each scanning step at a predetermined instant in time by determining a number N of scanning values for the receiver output signal, which corresponds to the number of matrix values, and by correlating these values. The scanning values are preferably correlated to the matrix values by forming a linear combination of the products of the sequence of scanning values and the sequence of matrix values. To determine the complete course of the filtered receiver output signal, the complete receiver output signal is successively scanned using individual scanning steps.

For a complete detection of the course of the individual receiver output signals, the scanning values of the receiver output signal, detected within one scanning step, are respectively offset against each other by one time interval, $\Delta t$, wherein the time interval $\Delta t = T/N$. In this case, T refers to the cycle duration of an individual receiver output signal and N to the number of scanning values within a scanning step. It is advantageous if four scanning values are detected during one scanning step, so that the time interval Δt corresponds to one fourth of the cycle duration of an individual receiver output signal.

Accordingly, the filtering matrix consists of a sequence of four matrix values, wherein the sequence of matrix values is generally adapted to the typical course of the individual receiver output signals to achieve an optimum filtering effect.

The pulsed individual receiver output signals at the light grid receivers are respectively composed of a positive signal peak, comprising the useful signal of the receiver, as well as a following negative signal peak which forms a spike and thus an interfering signal component in the individual receiver output signal.

To eliminate the interfering signal components in the individual receiver output signals, generated in this way, the filtering matrix is composed of an averaging component and a difference-forming component. It is particularly advantageous if the filtering matrix consists of a sequence of matrix values (1, 1, −1, −1), meaning that for generating a value for the filtered receiver output signal, the first two scanning values of the receiver output signal are added during one scanning step and that the following two scanning values are subtracted from this sum.

Since the filtering matrix values only comprise the values 1 or −1, the respective sums or differences of the scanning values only must be formed within one scanning step to correlate the receiver output signals and generate a receiver output signal value. No involved multiplications or divisions are required.

It is particularly advantageous if the sequence of the scanning values during one scanning step is offset by the time interval Δt to the sequence of scanning values for the preceding scanning step. In the individual scanning steps, the filtering matrix with the step width Δt is therefore pushed over the receiver output signal, thereby causing this signal to be completely scanned and filtered. The individual, successive receiver output signal values of the filtered receiver output signal accordingly are also offset in time against each other by Δt.

The first three scanning values of a scanning step can be taken over from the preceding scanning step since the sequence of values obtained in one scanning step is offset relative to the sequence of scanning values in the preceding scanning step by precisely the time interval Δt, which can also be used for generating the scanning values within one scanning step. This leads to a considerable simplification of the signal evaluation and thus to a significant reduction in the required, computation time.

To generate the object detection signal, the filtered receiver output signal is computed with at least one threshold value, wherein the height of the threshold value in principle can be specified as parameter value.

For one particularly preferred embodiment of the invention, an adaptive threshold value that is derived from the course of the unfiltered receiver output signal is used to evaluate the filtered receiver output signal. The threshold value advantageously is determined through averaging over the course of the receiver output signal. In particular for a light grid, several receiver output signals are generated cyclically and successively, wherein a predetermined number of receiver output signals is advantageously stored, so that the threshold value can be computed through averaging over several receiver output signals. By computing the threshold value in this way, the adaptive threshold value is already adapted to the course of the receiver output signal. The averaging also eliminates interfering signal influences, so that these do not influence the determination of the threshold value.

The optical sensor, in particular the light grid for realizing the method according to the invention, preferably comprises an evaluation unit with a digital signal processor.

An analog circuit for the pre-processing of receiver output signals is not needed when using a digital signal processor as component of the evaluation unit. Typically, only components for the impedance conversion, installed downstream of the receivers, are needed as analog circuit components for adapting the levels of the receiver output signals for reading into the digital signal processor.

Since the evaluation unit is left with almost no analog circuit components, it is not sensitive to external influences such as the EMC radiation or thermal drifting of individual circuit components.

BRIEF DESCRIPTION OF THE DRAWINGS

The invention is explained in the following with the aid of the accompanying drawings.

FIGS. 3a-3d show a chronological course of the receiver output signal from the light grid according to FIG. 1.

DETAILED DESCRIPTION OF THE INVENTION

Figure 1:
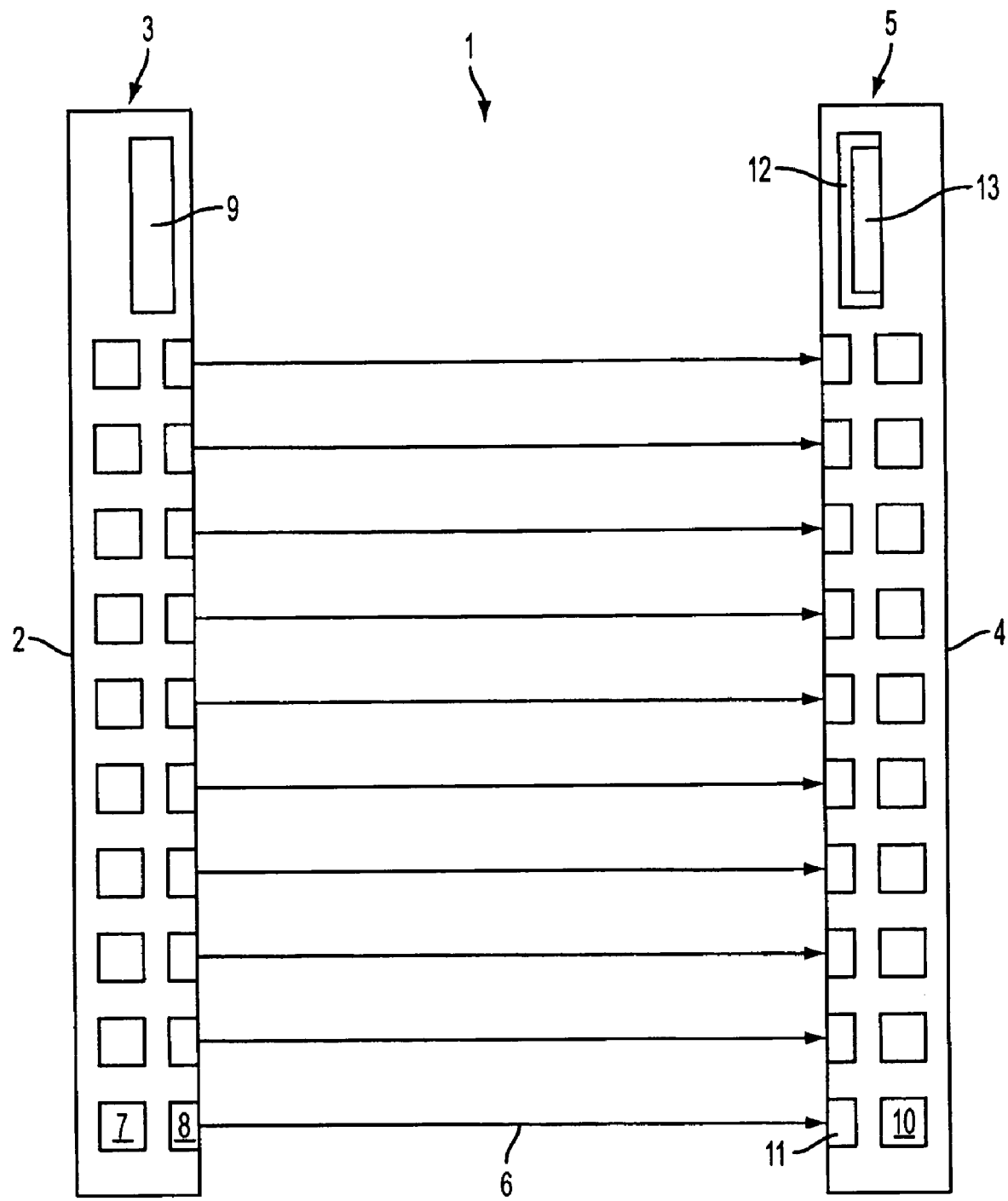
FIG. 1 is a schematic representation of an exemplary embodiment of an optical sensor embodied as light grid for detecting objects inside an area to be monitored.

FIG. 1 shows a design of an optical sensor embodied as light grid 1 for monitoring an area to be monitored. The light grid 1 comprises a transmitting unit 3, integrated into a first housing 2, and a receiving unit 5 that is integrated into a second housing 4. The transmitting unit 3 and the receiving unit 5 are positioned on opposite edges of the area to be monitored.

The transmitting unit 3 comprises an arrangement of transmitters 7 for emitting light rays 6. The transmitters 7 preferably are embodied as identical light-emitting diodes, disposed at a distance next to each other, wherein the transmitters 7 are preferably arranged equidistant along a straight line. Installed downstream of each transmitter 7 is a transmitting optic 8 which forms a beam with the transmitting light rays 6. The respective transmitting optic 8 is installed behind an exit window, not shown separately herein, in the front wall area of the housing 2. The transmitters 7 for this embodiment emit transmitting light rays 6 in the infrared range. However, the transmitters 7 in principle can also emit transmitting light rays 6 in the visible wavelength range.

The optical axes of the transmitting light rays 6 guided inside the area to be monitored extend parallel to each other in the plane for the area to be monitored.

The transmitters 7 are triggered by a transmitter control unit 9. The transmitters 7 for the present embodiment are operated in the pulsed mode, meaning the transmitters 7 emit transmitting light pulses with a predetermined pulse-interval ratio. The individual transmitters 7 cyclically emit successive transmitting light pulses, wherein these pulses are clocked by a transmitter control unit 9. In the process, the transmitters 7 are activated within one scanning cycle in accordance with their sequence in the transmitting unit 3 and in a predetermined scanning direction. The transmitting light pulses from the first transmitter 7 function to synchronize the light grid 1.

The transmitting light pulses from the first transmitter 7 are thus advantageously provided with a coding which clearly differs from the coding assigned to the transmitting light pulses coming from the remaining transmitters 7.

The receiving unit 5 comprises an arrangement of identical side-by-side arranged receivers 10. The receivers 10 preferably are individual photodiodes, arranged equidistant along a straight line. A separate receiving optic 11 is installed upstream of each receiver 10, wherein respectively one transmitter 7 of the transmitting unit 3 is positioned opposite one receiver 10. The beam for the present embodiment is formed with transmitting light rays 6, such that the transmitting light rays 6 of each separate transmitter 7 only impinge on the opposite-arranged receiver 10 if the beam path is clear. Each transmitter 7 and the associated receiver 10 jointly form one beam axis or path of the light grid 1.

The receivers 10 are controlled by a receiver control unit 12. The individual receiver output signals present at the outputs of the receivers 10 are evaluated in an evaluation unit 13 which forms a component of the receiver control unit 12. If the beam path for the light grid 1 is clear, the transmitting light rays 6 arrive without interference at the associated receivers 10 where they generate a reference receiver output signal that corresponds to a clear beam path.

If an object enters the area to be monitored, the beam path of the transmitting light rays 6 from at least one transmitter 7 is interrupted, meaning no further reference receiver output signals are recorded in this receiver 10.

The interruptions of the beam paths are evaluated in the evaluation unit 13 for generating an object detection signal.

The object detection signal is a binary switching signal with the switching states "0" and "1." The switching state "0" corresponds to a clear beam path of the light grid 1, meaning no object was recorded in the area to be monitored. The switching state "1" corresponds to an object intervention in the beam path for the light grid 1, wherein the interruption of a single beam path is preferably sufficient to indicate an object intervention. In the case where the light grid 1 is used in the area of safety engineering, generating an object-detection signal of this type will trigger the generating of a command for shutting down a machine or plant for which the surrounding area is monitored with a light grid 1.

The light grid 1 in that case forms a personal protection device which prevents persons from entering the area surrounding a machine while the machine is in operation.

The term light grid 1 generally refers to multiple arrangements of light barriers and light curtains.

In principle, the light grid 1 can also be embodied as a transceiver, meaning the transmitters 7 of the transmitting unit 3 and the receivers 10 of the receiving unit 5 are disposed inside a joint housing, arranged at one edge of the area to be monitored. In that case, a reflector is disposed at the opposite edge of the area to be monitored. With a clear beam path for the light grid 1, the light rays 6 emitted by the transmitters 7 will be reflected back via this reflector to the associated receivers 10.

Figure 2:
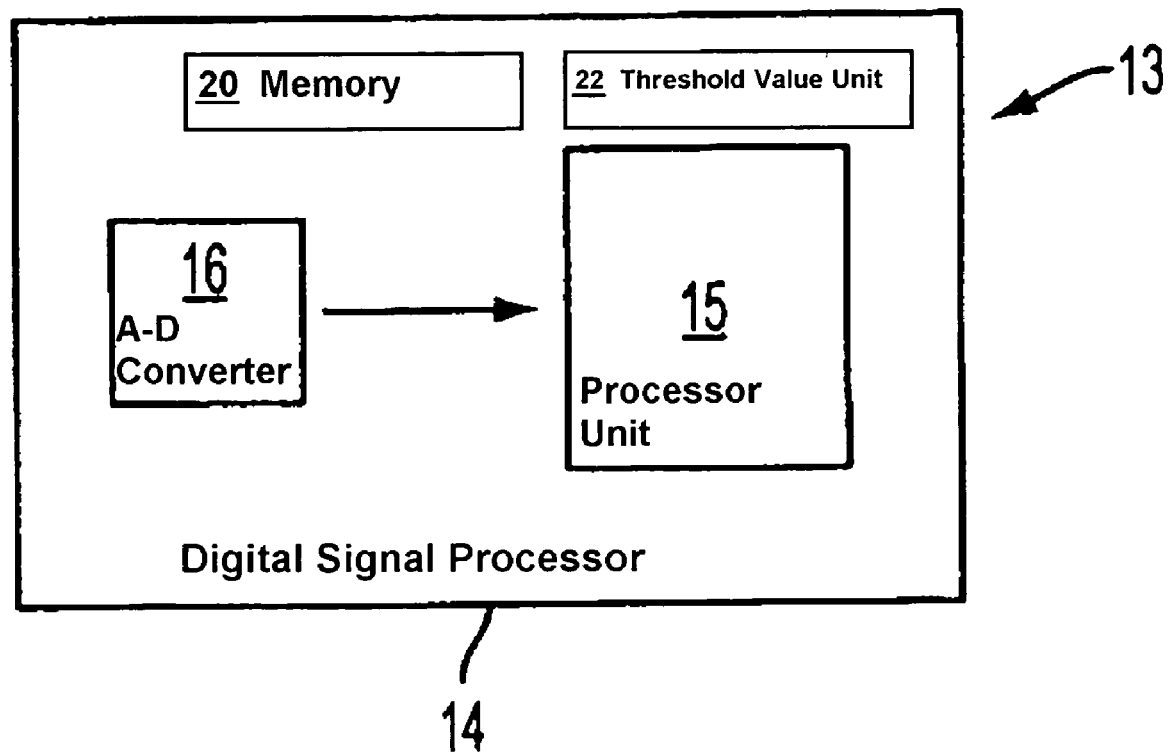
FIG. 2 is a schematic representation of an evaluation unit embodied as digital signal processor for the light grid according to FIG. 1.

FIG. 2 shows an embodiment of an evaluation unit 13 for a light grid 1 which is used for non safety-critical applications. The evaluation unit 13 consequently has a single-channel design.

The evaluation unit 13 according to FIG. 2 consists of a digital signal processor 14. The digital signal processor 14 is provided with an analog-digital converter 16, arranged upstream of the actual processor unit 15. The analog-digital converter 16 in this case is an 8-bit analog-digital converter 16, meaning the analog-digital converter 16 has a word width of n=8 bit. Other bit widths can generally be used as well, depending on the resolution of the analog-digital converter 16, wherein this analog digital converter 16 is used to digitize the receiver output signals. The evaluation unit 13 also includes a memory 20 and a threshold value unit 22.

The evaluation unit 13 has a two-channel design if the light grid 1 is used for safety-critical applications. In that case, the evaluation unit 13 comprises two digital signal processors 14 that monitor each other, wherein an analog-digital converter 16 is installed upstream of each digital signal processor 14.

The evaluation unit 13 of the present embodiment, shown in FIG. 2, is provided with an upstream-installed integrated circuit which is not shown herein. In this integrated circuit, negative individual receiver output signals with reversed mathematical signs are generated which correspond to the individual receiver output signals generated in the receivers 10. The positive and negative individual receiver output signals are emitted at two outputs of the integrated circuit and are supplied to a differential amplifier, not shown herein, which is designed as an operational amplifier. The differences between positive and negative individual receiver output signals, formed in the differential amplifier, are supplied via the analog-digital converter 16 to the digital signal processor 14.

The receiver control unit 12 is provided with a timing unit, not shown herein, for activating the individual receivers 10, such that they are activated synchronized with the respectively associated transmitters 7. As a result, the receivers 10 are activated cyclically and successively, in the same way as the transmitters 7. The individual receiver output signals, which are generated successively in the receivers 10 with the timing predetermined by the receiver control unit 12 and are pre-processed in the integrated circuit and the differential amplifier, are then read into the digital signal processor 14 of the evaluation unit 13. The analog receiver output signals from the receiver 10 are serially digitized in the analog-digital converter 16. The chronological course of the combined receiver output, signal, generated in this way and stored in the digital signal processor 14, consist of the sequence of individual receiver output signals shown in FIGS. 3a and 3b.

Corresponding to the number K of receivers 10 for the light grid 1, the receiver output signal consists of a sequence of K individual receiver output signals $E_i$ (i=1 ... K). The cycle length T of an individual receiver output signal $E_i$ follows from the duration of the transmitting-light pulses emitted by the respective transmitter 7. In the present case, the individual receiver output signals $E_i$ have the same cycle length T. Small signal intervals remain between the individual receiver output signals $E_i$, corresponding to the timing frequency for successively activating the transmitter-receiver pairs. FIG. 3b illustrates the complete course of the receiver output signal during one cycle of the light grid 1 in which all transmitter-receiver pairs are activated once. FIGS. 3a and 3b also show the case where, a beam path is clear and none of the beam paths are interrupted by an object intervention.

Owing to the receiver characteristics and the signal pre-processing of the receiver output signal, the individual receiver output signals $E_i$ always take the signal course shown in FIGS. 3a and 3b. Each individual receiver output signal $E_i$ thus consists of a positive signal peak followed by a negative signal peak. The positive signal peak contains the useful signal component while the negative signal peak represents a pulse spike following the positive signal peak and forms the interference signal component.

In the event that one of the beam paths is interrupted, no transmitting light pulse is recorded in the respective receiver 10, so that the individual receiver output signal $E_i$ ideally assumes the value zero.

In principle, the receiver output signal can be evaluated with a threshold value in order to generate the object detection signal wherein this threshold value is right above the zero level of the receiver output signal. An uninterrupted beam path would exist if the corresponding individual receiver output signal $E_i$ would exceed the threshold value. Accordingly, the beam path would be interrupted if the individual receiver output signal $E_i$ would remain below the threshold value.

However, due to external interfering influences such as external light irradiation or due to internal interferences caused by structural components, the respective individual receiver output signals $E_i$ do not have identical courses, as shown in FIGS. 3a and 3b. Rather, the positive and negative signal peaks of the individual receiver output signals $E_i$ vary. The direct voltage levels of the individual receiver output signals $E_i$ furthermore can also vary. For that reason, using a threshold value evaluation of the receiver output signal would not ensure a secure object detection.

To increase the detection sensitivity of the light grid 1, the filtered receiver output signal shown in the FIGS. 3c and 3d is therefore generated in the digital signal processor 14 from the receiver output signal by a filtering operation realized with a filtering matrix, as depicted in FIGS. 3a and 3b. With the filtered receiver output signal, the object detection signal is then generated in the digital signal processor 14 by a threshold evaluation.

For filtering the receiver output signal, this signal is scanned in a time interval $\Delta t$ and the receiver output signal values, determined during the individual scanning steps, correlated with the filtering matrix.

The individual scanning time instants are given the references $t_1, t_2, \ldots$ in the FIG. 3a. Respectively two successive time instants $t_n, t_{n+1}$ are offset by the time interval $\Delta t$. The time interval for the present case is $\Delta t = T/4$, meaning one fourth of a cycle length of an individual receiver output signal $E_i$.

The receiver output signal is scanned successively in individual steps for filtering the receiver output signal, wherein the receiver output signal values determined during each scanning step are correlated with the filtering matrix.

The filtering matrix M consists of a sequence of four matrix values ($M_1$, $M_2$, $M_3$, $M_4$). These matrix values comprise an averaging component and a difference-forming component, wherein the filtering matrix in the present case is formed with the following matrix values: $M=(1, 1, -1, -1)$.

During one scanning step, respectively four successive scanning values $A_i$ of the receiver output signal are determined, which are respectively offset by one time interval $\Delta t$, and are correlated with the filtering matrix by forming a linear combination of the products formed with the sequence of scanning values $A_i$ and the sequence of matrix values. The receiver output signal value $F(t)$, determined in this way, as a discrete function value of the filtered receiver output signal at the time instant t is thus obtained according to the following equation:

$$F(t)=A_i(t-3/2\Delta t)\cdot M_1+A_{i+1}(t-1/2\Delta t)\cdot M_2+A_{i+2}(t+1/2\Delta t)\cdot M_3+A_{i+3}(t+3/2\Delta t)\cdot M_4$$

F(t) in this case represents the receiver output signal value determined during the scanning step i. For this, the scanning value sequences of two successive scanning steps are offset relative to each other by the time interval $\Delta t$. This means that the filtering matrix for the individual scanning steps is respectively advanced by the time interval $\Delta t$ for scanning the receiver output signals. The scanning values determined during one scanning step extend respectively over one cycle T of a single receiver output signal $E_i$ and are in each case offset equidistant by the time interval $\Delta t$.

In a first scanning step, the receiver output signal in FIG. 3a is scanned at time instants $t_0, t_1, t_2, t_3$, resulting in the following receiver output signal value $F(\tau_0)$ $$F(\tau_0)=A_0(t_0)\cdot 1+A_1(t_1)\cdot 1+A_3(t_3)\cdot(-1)+A_4(t_4)\cdot(-1)$$

The time instant $\tau$ of the receiver output signal is defined through the following equation:

$$\tau=(t_1+t_2)/2$$

The result of the first scanning step therefore is:

$$F[1/2(t_1+t_2)]=A_0(t_0)+A_1(t_1)-A_2(t_2)-A_3(t_3)$$

With the second scanning step, the matrix values $M_i$ of the filtering matrix are correlated with the scanning values $A_i$ at time instants $t_1, t_2, t_3, t_4$. Consequently, the result of the second scanning step is:

$$F[1/2(t_2+t_3)]=A_1(t_1)+A_2(t_2)-A_3(t_3)-A_4(t_4)$$

The result of the third scanning step is:

$$F[1/2(t_3+t_4)]=A_2(t_2)+A_3(t_3)-A_4(t_4)-A_5(t_5)$$

The receiver output signal is therefore scanned completely during successive steps and the values determined during the scanning steps are respectively correlated with the filtering matrix.

Since the filtering matrix for each scanning step is respectively moved past the receiver output signal by one time interval and the scanning values for computing a receiver output signal value are simply added or subtracted with the matrix values of the filtering matrix, the scanning values $A_i$, $A_{i+1}$, $A_{i+2}$, $A_{i+3}$ determined during one scanning step i, are advantageously stored temporarily in the digital signal processor 14. In the following scanning step i+1, the scanning values $A_i$, $A_{i+1}$, $A_{i+2}$, $A_{i+3}$ from the preceding scanning step i can then be used again to compute the current receiver output signal value.

FIGS. 3c and 3d show that the filtered receiver output signal has a considerably higher useful signal component than the non-filtered receiver output signal.

A threshold evaluation of the filtered receiver output signal consequently increases the detection security of the optical sensor.

FIGS. 3c and 3d further show that a threshold value S is used for evaluating the filtered receiver output signal, wherein several threshold values can also be used in principle for evaluating the filtered receiver output signal.

An adaptive threshold value S is used for the present case to evaluate the receiver output signal, wherein this threshold value is obtained through averaging over the course of the unfiltered receiver output signal. In the simplest case, the averaging is by means of a receiver output signal, generated during one cycle of the light grid 1. However, it is advantageous if the receiver output signals are averaged over several cycles, thus mostly eliminating interfering components, in the receiver output signal.

The invention has been described in detail with respect to preferred embodiments, and it will now be apparent from the foregoing, to those skilled in the art, that changes and modifications may be made without departing from the invention in its broader aspects, and the invention, therefore, as defined in the appended claims, is intended to cover all such changes and modifications that fall within the true spirit of the invention.

What is claimed is:

1. A method for processing a receiver output signal of an optical sensor, comprising the following steps:
   storing a course of the receiver output signal;

scanning the receiver output signal in a predetermined time interval Δt to create scanning values;

correlating the scanning values with a filtering matrix composed of a sequence of matrix values for generating a filtered receiver output signal composed of a discrete sequence of receiver output signal values; and evaluating the filtered receiver output signal values with at least one threshold value for generating an object detection signal.

2. The method according to claim 1, wherein the scanning step includes scanning the receiver output signal during several scanning steps, and determining a partial sequence of scanning values each being respectively offset by a time interval Δt during each scanning step and given a number N which corresponds to a number of matrix values, and computing a receiver output signal value for the filtered receiver output signal by correlating the values respectively determined during one scanning step with the sequence of matrix values.

3. The method according to claim 2, wherein the computing step includes determining the receiver output signal value from a linear combination of the products of the sequence of scanning values determined during one scanning step and the sequence of matrix values of the filtering matrix.

4. The method according to claim 3, wherein the computing step includes determining in each case a receiver output signal value at time instant t by using a number of N/2 or (N−1)/2 scanning values located before and after the scanning values at time instant t.

5. The method according to claim 3, wherein the scanning step includes offsetting in time the sequence of scanning values for one scanning step by the time interval Δt with respect to the sequence of scanning values obtained during the preceding scanning step.

6. The method according to claim 2, wherein the computing step includes forming a combined receiver output signal with a sequence of individual receiver output signals having respectively a cycle length T, wherein the time interval Δt=T/4.

7. The method according to claim 6, wherein the filtering matrix comprises a sequence of four matrix values.

8. The method according to claim 7, wherein the sequence (1, 1, 1−, 1−) forms the matrix values that represent the filtering matrix.

9. The method according to claim 1, wherein the evaluating step includes evaluating the filtered receiver output signal with at least one predetermined threshold value.

10. The method according to claim 1, wherein the evaluating step includes evaluating the filtered receiver output signal is with at least one adaptive threshold value derived from the receiver output signal.

11. The method according to claim 10, wherein the evaluating step includes averaging the threshold value over the receiver output signal course.

12. The method according to claim 10, further comprising generating several receiver output signals cyclically and successively with the optical sensor and storing the signal courses.

13. The method according to claim 12, wherein the evaluating step includes obtaining the threshold value through averaging over a predetermined number of receiver output signal courses.

14. An optical sensor system for implementing a method for processing a receiver output signal of an optical sensor comprising:

at least one transmitter for emitting light rays;

at least one optical receiver for receiving the light rays transmitted by the at least one transmitter, wherein the optical receiver outputs a receiver output signal based on the transmitted light rays; and an evaluation unit including: a memory for storing the receiver output signal, a computer unit for scanning the receiver output signal in a predetermined time interval Δt to create scanning values, correlating the scanning values with a filtering matrix, the matrix being composed of a sequence of matrix values, and generating a filtered receiver output signal composed of a discrete sequence of receiver output signal values; and a threshold value unit for evaluating the filtered receiver output signal, with respect to at least one threshold value, for generating an object detection signal.

15. The optical sensor system according to claim 14, wherein the sensor comprises a light grid with a predetermined number of beam paths.

16. The optical sensor system according to claim 15, wherein the at least one transmitter includes the predetermined number of transmitters and the at least one receiver includes the predetermined number of receivers and each beam path is created by one of the transmitters emitting light rays and an associated one of the receivers, wherein the transmitters and the receivers of the beam paths are, activated cyclically, one after another.

17. The optical sensor system according to claim 16, wherein the individual receiver output signals which are present at the successively activated individual receivers within one cycle are combined to form the course of the receiver output.

18. The optical sensor system according to claim 14, wherein the evaluation unit is constituted by a digital signal processor.

19. The optical sensor system according to claim 18, wherein at least one analog-digital converter is assigned associated with the digital signal processor by which the individual signals of the combined receiver output signal are converted to digital signals.

20. The optical sensor system according to claim 19, wherein the analog-digital converter is integrated into the digital signal processor.

21. A method for processing receiver output signals for a light grid having a predetermined number of beam axes, wherein each beam axis comprises a transmitter for emitting light rays and an associated receiver, and wherein the transmitters and the receivers are activated cyclically, one after another, the method comprising:

storing a course of a receiver output signal during a cycle, the cycle comprising a sequence in time of individual receiver output signals from the receivers;

scanning the receiver output signal in scanning steps offset by a predetermined time interval Δt, wherein a partial sequence of N scanning values, respectively offset by the time interval Δt, is determined during each scanning step;

correlating the scanning values with a filtering matrix, the filtering matrix comprising a sequence of N matrix values for generating a filtered receiver output signal comprising a discrete sequence of receiver output signal values, by forming a linear combination of the products of the sequence of scanning values and the sequence of matrix values, wherein the filtering matrix has an averaging share and a differential-forming share in order to eliminate interference signal shares in the receiver output signal; and evaluating the filtered receiver output signal with at least one threshold value for generating an object detection signal.

22. The method according to claim 21, wherein a receiver output signal value at a point in time t is determined using N/2 or (N−1)/2 scanning values from the scanning values located before and after the instant t.

23. The method according to claim 21, wherein the receiver output signal comprises a sequence of individual receiver output signals having an interval length T, wherein the time interval Δt=T/4.

24. The method according to claim 23, wherein the filtering matrix comprises a sequence of four matrix values.

25. The method according to claim 24, wherein the filtering matrix comprises matrix values formed with the sequence (1, 1, −1, −1).

26. The method according to claim 21, further comprising weighting the filtered receiver output signal with at least one fixed, predetermined threshold value.

27. The method according to claim 21, further comprising weighting the filtered receiver output signal with at least one adaptive threshold value, derived from the receiver output signal.

28. The method according to claim 27, wherein processing of the receiver output signals occurs in a digital signal processor.

* * * * *

UNITED STATES PATENT AND TRADEMARK OFFICE
CERTIFICATE OF CORRECTION

PATENT NO. : 7,569,843 B2
APPLICATION NO. : 11/135671
DATED : August 4, 2009
INVENTOR(S) : Lutz Lohmann It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1060 days.

Signed and Sealed this

Seventh Day of September, 2010

David J. Kappos
*Director of the United States Patent and Trademark Office*